(12) United States Patent
Niiro

(10) Patent No.: US 6,794,679 B2
(45) Date of Patent: Sep. 21, 2004

(54) SEMICONDUCTOR DEVICE THAT CAN MEASURE TIMING DIFFERENCE BETWEEN INPUT AND OUTPUT SIGNALS

(75) Inventor: Mitsutaka Niiro, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/611,878

(22) Filed: Jul. 3, 2003

(65) Prior Publication Data

US 2004/0140466 A1 Jul. 22, 2004

(30) Foreign Application Priority Data

Jan. 20, 2003 (JP) ........................... 2003-010917

(51) Int. Cl.⁷ .......................................... H01L 23/58
(52) U.S. Cl. ............................... 257/48; 257/798
(58) Field of Search ............................ 257/48, 798

(56) References Cited

U.S. PATENT DOCUMENTS

| 6,333,880 B1 | * | 12/2001 | Mitsui | 365/201 |
| 2001/0019284 A1 | * | 9/2001 | Buck | 327/233 |
| 2003/0116763 A1 | * | 6/2003 | Yamazaki et al. | 257/48 |

FOREIGN PATENT DOCUMENTS

JP 11-133167 5/1999

* cited by examiner

Primary Examiner—Ngân V. Ngô
(74) Attorney, Agent, or Firm—McDermott Will & Emery LLP

(57) ABSTRACT

A semiconductor device includes an internal circuit carrying out a predetermined process in accordance with an input signal, and a comparison circuit comparing the time required for an output signal in accordance with a predetermined process to be output and an input signal propagation time of an electric line having a line length adjusted to transmit a signal in a desired time

9 Claims, 9 Drawing Sheets

SEMICONDUCTOR DEVICE THAT CAN MEASURE TIMING DIFFERENCE BETWEEN INPUT AND OUTPUT SIGNALS

BACKGROUND OF THE INVENTION

1. Field of the Invention

The present invention relates to semiconductor devices, and more particularly to a semiconductor device that can measure the timing difference between input and output signals.

2. Description of the Background Art

One important characteristic test of a semiconductor device is the timing measurement of measuring the time starting from a trigger input up to completion of a predetermined operation. One representative example of timing measurement is the measurement of an access time defined as starting from an issue of a read out request up to the actual appearance of output data.

In such timing measurement, the timing difference between an input signal to a semiconductor device and an output signal from the semiconductor device in response to that input signal must be measured at high accuracy. To this end, Japanese Patent Laying-Open No. 11-33167 (referred to as "conventional art" hereinafter), for example, discloses the approach to measure the timing difference between input and output signals in a unit to be tested (also called DUT "Device Unit Testing" hereinafter) at high accuracy through an external measurement apparatus.

The need arises for timing measurement to be conducted at higher accuracy in accordance with the high frequency operation of recent semiconductor devices. For example, a Double Data Rate SDRAM (referred to as DDR-SDRAM hereinafter) operating at an external operating clock of 133 MHz requires a measurement accuracy of not more than 0.1 ns for tAC defining the timing period between an external clock signal and the second subsequent output data in a burst read operation.

However, timing measurement of high accuracy using an external measurement apparatus as disclosed in the aforementioned Japanese Patent Laying-Open No. 11-133167 requires the provision of additional external measurement facility. This is because difference in the path length of a plurality of electric lines establishing connection between a DUT and a measurement apparatus must be corrected at high accuracy. In order to conduct timing measurement at high accuracy even if distortion occurs in the input and output signals caused by the crosstalk and parasitic capacitance between the plurality of electric lines, an expensive measurement apparatus of extremely high performance is required. Accordingly, the cost for measurement facility as well as the production cost will increase drastically.

SUMMARY OF THE INVENTION

An object of the present invention is to provide a semiconductor device of low cost that allows measurement of timing difference between input and output signals at high accuracy.

According to an aspect of the present invention, a semiconductor device with a normal mode and a test mode as an operation mode includes an internal circuit executing a predetermined process in accordance with an input signal to provide an output signal in accordance with the predetermined process, a delay circuit delaying the input signal by respective different delay times to output n (n: natural number) delay signals in the test mode, and n comparison circuits provided corresponding to the n delay signals, respectively. Each of the n comparison circuits outputs a comparison result indicating which of a corresponding delay signal output and the output signal from the internal circuit is output earlier in said test mode.

The semiconductor device of the present invention can measure and evaluate the time required for an output signal of a predetermined process carried out by the internal circuit in response to an input signal to be output from the semiconductor device, based on a comparison result between the input signal respectively having a plurality of different delay times applied by a delay circuit and an output signal from the internal circuit. In other words, the timing difference between input and output signals can be measured in high accuracy without taking into account the adverse effect of the electrical wiling path between an external tester device and a semiconductor device that is the subject of measurement on the measurement accuracy. This eliminates the need of an expensive measurement apparatus of high performance. The increase in production cost corresponding to increase in the cost of the measurement facility can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
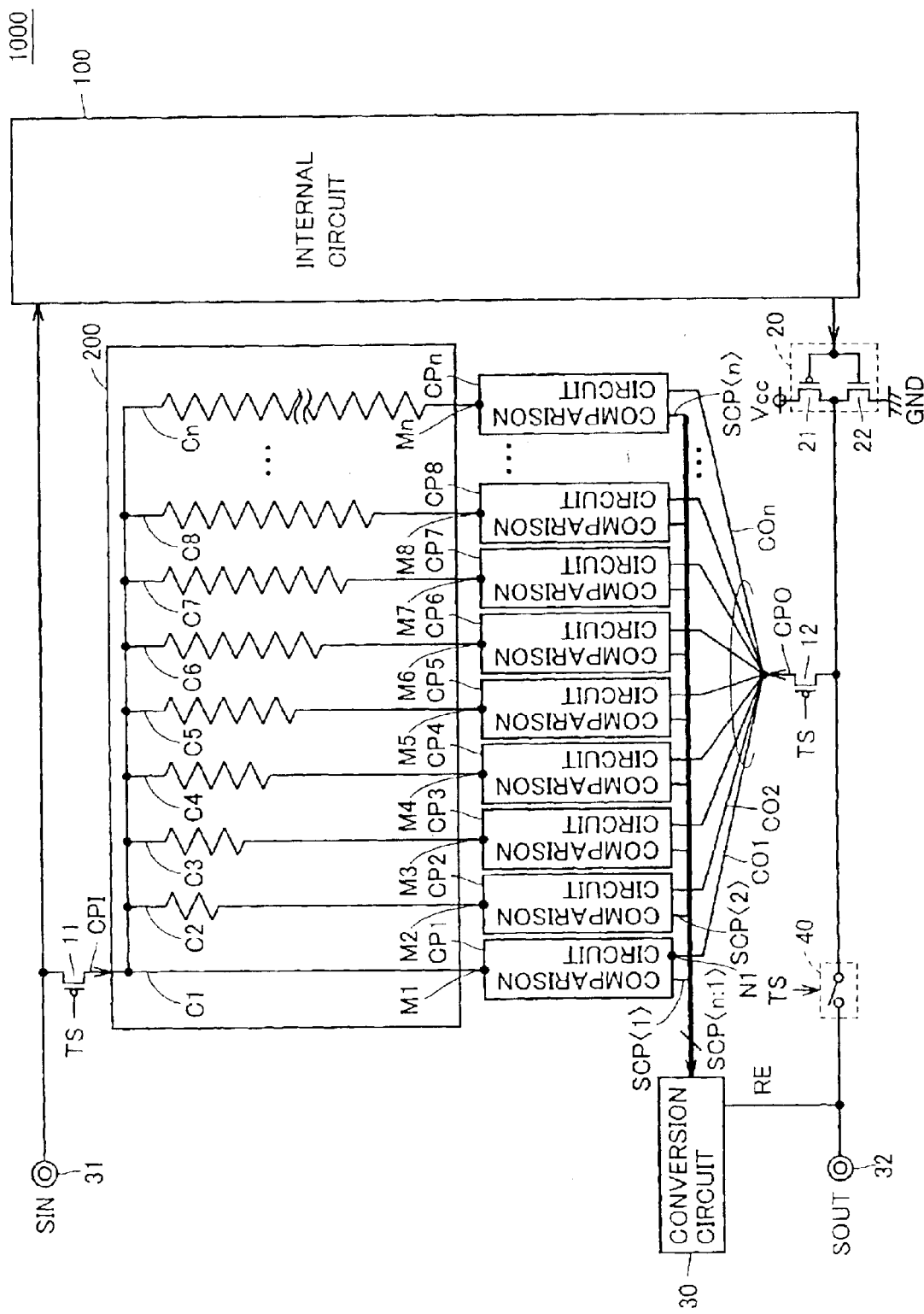
FIG. 1 is a block diagram of a semiconductor memory device representative as a semiconductor device of the present invention, corresponding to a structure related to timing measurement.

Embodiments of the present invention will be described hereinafter with reference to the drawings. In the drawings, the same reference characters denote the same or corresponding elements.

First Embodiment

The present invention is applicable in common to a semiconductor device including an internal circuit that executes a predetermined process in response to an input signal functioning as a trigger to output a signal corresponding to the executed predetermined process at a timing meeting a predetermined standard. An embodiment based on measurement of tAC in a semiconductor memory device 1000 that is, for example, a DDR-SDRAM will be described hereinafter.

Semiconductor memory device 1000 operates in two modes, i.e., a normal mode in which a normal operation is carried out and a test mode in which the timing difference between input and output signals is measured. In a normal mode, a test signal TS generated by an internal circuit (not shown) in semiconductor memory device 1000 is set at an H level (logical high). In a test mode, test signal TS is set at an L level (logical low).

Referring to FIG. 1, semiconductor memory device 1000 includes an input terminal 31, an internal circuit 100, a data output circuit 20, a switch circuit 40, and an output terminal 32.

An input signal SIN is applied to input terminal 31. Input signal SIN is, for example, a clock signal. Input terminal 31 is, for example, a clock terminal to which a clock signal is input.

Internal circuit 100 is a generic representation of a memory cell array and a peripheral circuit. Internal circuit 100 carries out a predetermined process according to input signal SIN, and outputs a signal to data output circuit 20 in both a normal mode and a test mode.

Data output circuit 20 is formed of, for example, a CMOS (Complementary Metal Oxide Semiconductor) inverter buffer. Data output circuit 20 includes a P channel MOS transistor 21 and an N channel MOS transistor 22 connected in series between a power supply voltage Vcc and a ground voltage GND. Data output circuit 20 amplifies a signal applied from internal circuit 100, and outputs a signal of an inverted level with respect to the input signal. In the following, the binary high voltage state (for example, power supply voltage Vcc) and a low voltage state (for example, ground voltage GND) of a signal, data, or the like are also referred to as an H level and an L level, respectively. A signal prefixed by the symbol "/" implies an inverted version of a corresponding signal without the prefix of "/".

Switch circuit 40 electrically connects data output circuit 20 with output terminal 32 when test signal TS of an H level is input in a normal mode. In a test mode, switch circuit 40 electrically disconnects data output circuit 20 from output terminal 32 when test signal TS of an L level is input.

Output terminal 32 provides the signal from data output circuit 20 as an output signal SOUT in a normal mode. Output signal SOUT is, for example, a data signal read out from a memory cell array (not shown) in internal circuit 100. Output terminal 32 is, for example, a DQ terminal from which a data signal is output.

Therefore, in a normal mode, semiconductor memory device 1000 carries out a predetermined process in internal circuit 100 according to an input signal SIN applied from input terminal 31. Semiconductor memory device 1000 provides the signal from internal circuit 100 as an output signal SOUT from output terminal 31 via data output circuit 20.

Semiconductor memory device 1000 further includes a P channel MOS transistor 11 and a delay circuit 200.

P channel MOS transistor 11 is provided between the connection node of input terminal 31 and internal circuit 100 and delay circuit 200. Test signal TS is input to the gate of P channel MOS transistor 11. In the present embodiment, a P channel MOS transistor is used to provide electrical connection between input terminal 31 and delay circuit 200. Alternatively, an N channel MOS transistor may be used.

Delay circuit 200 includes electric lines C1–Cn each having a different path length for transmitting an electric signal. Therefore, electric lines C1–Cn will delay an input signal by respectively different delay times. In the following, electric lines C1–Cn are also generically referred to as electric line Cn.

Figure 2A:
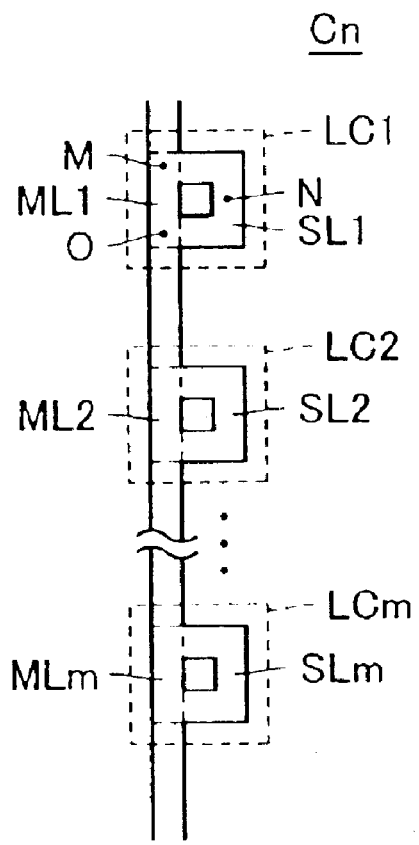
FIGS. 2A and 2B are diagrams to describe a structure of an electrical wiring that allows altering the path length of an electric signal.

Referring to FIG. 2A, electric line Cn includes path length modify sections LC1–LCm to apply a predetermined propagation delay time to an electric signal. Path length modify section LC1 includes a main line portion ML1 connecting a point M and a point O at the shortest distance, and a sub line portion SL1 connecting point M and point O via a point N. Path length modify sections LC2–LCm include main line portions ML2–MLm, respectively, bkewise path length modify section LC1. Path length modify sections LC2–LCm also include sub line portions SL2–SLm, respectively, likewise path length modify section LC1.

Figure 2B:
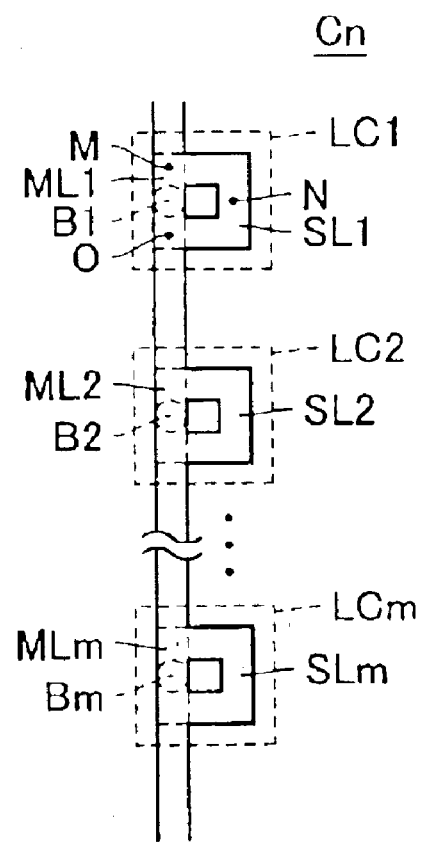

Referring to FIG. 2B, path length modify section LC1 of electric line Cn includes a fuse B1 to break the electrical connection between points M and O on main line portion ML1. Path length modify sections LC2–LCm include fuses B2–Bm, respectively, likewise path length modify section LC1.

By blowing fuse B1 in path length modify section LC1 using laser or the like, the electric signal transmitted through the shortest distance from point M to point O can be transmitted through the route of point N. Thus, the path length of an electric signal can be modified depending on whether fuse B1 is blown or not in path length modify section LC1, whereby the propagation time of a signal between points M and O can be altered.

Therefore, by designing electric line Cn so that the difference in the propagation time from point M to point O before and after blowing out fuse B1 becomes, for example 10 ps, an electric signal propagation time difference of 100 ps (0.1 ns) can be established between electric line Cn with no fuses B1–Bm blown and electric line Cn with ten fuses out of fuses B1–Bm blown. Thus, the signal propagation time can be increased in increments of a predetermined time sequentially in the order of electric lines C1–Cn by setting 0 to (n−1) blown fuses among fuses B1–Bm of electric lines C1–Cn.

Referring to FIG. 1 again, each of electric lines C1–Cn receives input signal SIN from input terminal 31 as a comparison signal CPI when P channel MOS transistor 11 is turned on in a test mode. Each of electric lines C1–Cn transmits comparison signal CPI with a propagation time increased in increments of a predetermined time sequentially in the order of electric lines C1–Cn.

Semiconductor memory devices 1000 further includes a P channel MOS transistor 12, comparison circuits CP1–CPn, and signal lines CO1–COn.

P channel MOS transistor 12 is provided between signal lines CO1–COn and the connection node of switch circuit 40 and data output circuit 20. Test signal TS is applied to the gate of P channel MOS transistor 12. Although a P channel MOS transistor is employed to establish electrical connection between signal lines CO1–COn and the connection node of switch circuit 40 and data output circuit 20 in the present embodiment, an N channel MOS transistor may be used instead.

Signal lines CO1–COn are arranged between respective comparison circuits CP1–CPn and P channel MOS transistor 12. Each of signal lines CO1–COn has a structure similar to that of electric line Cn. Signal lines CO1–COn are adjusted by blowing appropriate fuses of signal lines CO1–COn so that signal lines CO1–COn all have an equal line length. The line length of signal lines CO1–COn is set so that the time required for the output signal from data output circuit 20 to arrive at data terminal 32 in a normal mode is equal to the time required for the output signal from data output circuit 20 to arrive at comparison circuits CP1–CPn via P channel MOS transistor 12 and respective signal lines CO1–COn in a test mode.

Comparison circuits CP1–CPn are provided between electric lines C1–Cn and signal lines CO1–COn, respectively. For the sake of describing the operation of semiconductor memory device 1000 in a test mode, the connection node of signal line CO1 and comparison circuit CP1 is referred to as a connection node N1, whereas the connection nodes between electric lines C1–Cn and comparison circuits CP1–CPn are referred to as connection nodes M1–Mn, respectively. The voltage level of respective connection nodes between signal lines CO2–COn and comparison circuits CP2–CPn is equal to the voltage level of connection node N1. The output signal from output circuit 20 is applied to each of comparison circuits CP1–CPn as a comparison signal CPO in a test mode via P channel MOS transistor 12 and a corresponding signal line among signal lines CO1–COn.

In the following, comparison circuits CP1–CPn and signal lines CO1–COn are also generically represented as a comparison circuit CPn arid a signal line COn, respectively.

Figure 3:
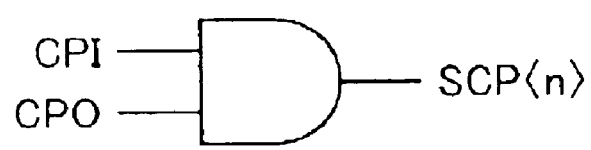
FIG. 3 is a circuit diagram of a structure of a comparison circuit.

Referring to FIG. 3, comparison circuit CPn is formed, by way of example, of an AND circuit. Each comparison circuit CPn outputs a determination signal SCP<n>, corresponding to a logical product between a comparison signal CPI input via electric line Cn and a comparison signal CPO. Therefore, comparison circuits CP1–CPn output determination signals SCP<1> to SCP<n>, respectively. In the following. determination signals SCP<1> to SCP<n> are also generically represented as determination signal SCP<n:1>. In the present specification, a similar representation is employed when the signal of a plurality of bits is to be represented generically.

Referring to FIG. 1 again, semiconductor memory device 1000 further includes a conversion circuit 30.

Conversion circuit 30 converts determination signal SCP<n:1> formed of a plurality of bits into a determination signal RE of one bit for output in a test mode. Specifically, conversion circuit 30 carries out parallel-serial conversion. Determination signal RE from conversion circuit 30 is output from output terminal 32 as output signal SOUT.

As described above, semiconductor memory device 1000 outputs from output terminal 32 the output signal from data output circuit 20 in a normal mode. In a test mode, semiconductor memory device 1000 outputs from output terminal 32 the determination signal RE from conversion circuit 30. Therefore, a terminal to output determination signal RE indicating the measurement result of the timing difference between input and output signals does not have to be additionally provided in semiconductor memory device 1000.

Figure 4:
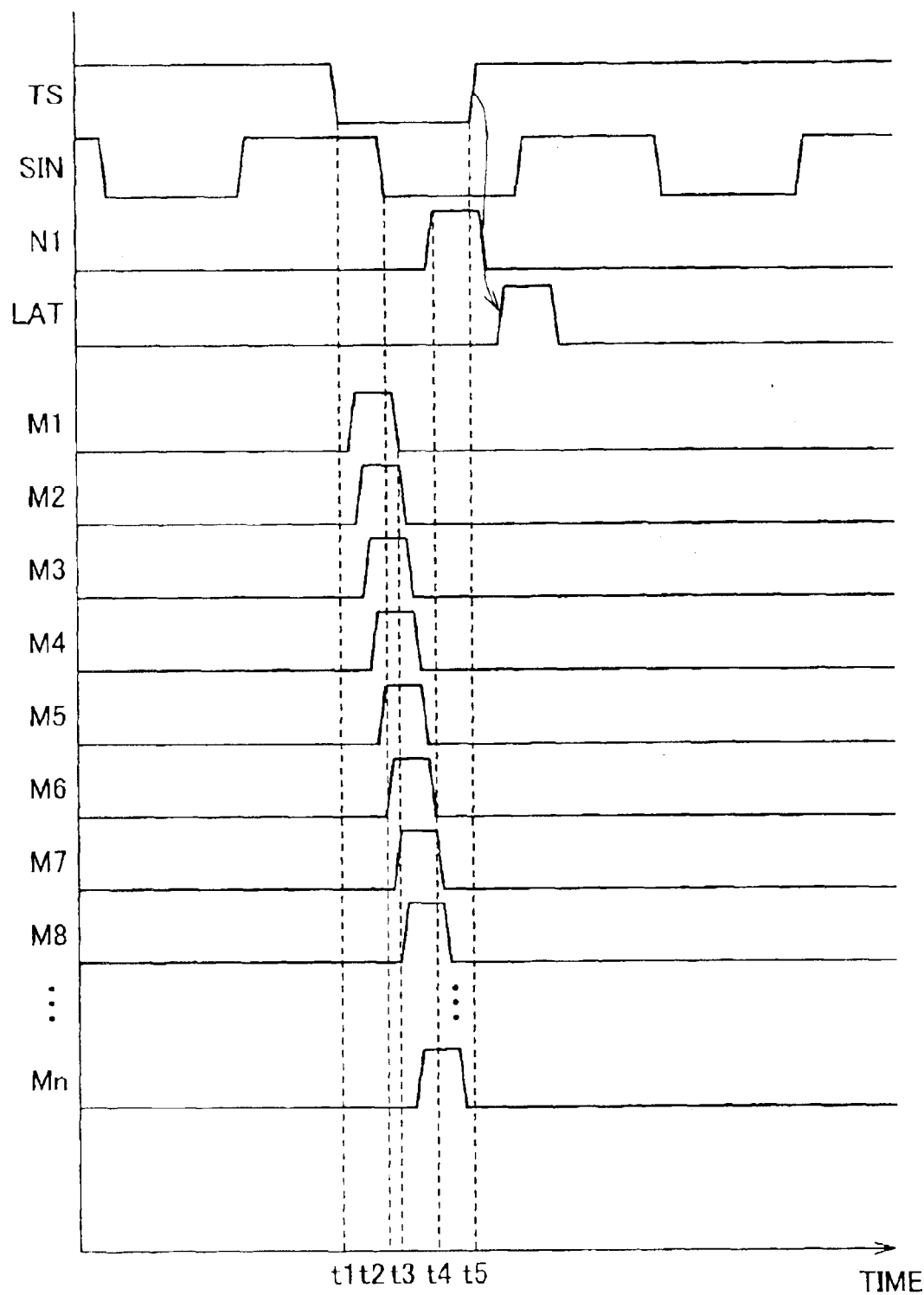
FIG. 4 is an operation waveform diagram to describe an operation of a semiconductor device in a test mode.

FIG. 4 is an operation waveform diagram to describe an operation of semiconductor memory device 1000 in a test mode. More specifically, FIG. 4 is an operation waveform diagram to describe an operation of semiconductor memory device 1000 for tAC measurement.

Referring to FIGS. 1 and 4, M1–Mn designate the voltage level of connection nodes M1–Mn, respectively. N1 designates the voltage level of connection node N1. The time required for comparison signal CPO to be transmitted to connection node N1 in a test mode is equal to the time required for the output signal from data output circuit 20 to arrive at output terminal 32 in a normal mode. It is assumed that input signal SIN is a clock signal.

The DDR-SDRAM operates in synchronization with the rise and fall of an externally applied clock signal (also referred to "as external clock" hereinafter). DDR-SDRAM includes an internal clock generation circuit (not shown) from which an internal clock in synchronization with an external clock is generated. A data signal is output according to the generated internal clock. tAC is the difference in time between the rising or falling time of the external clock and the output time of the second output data signal and et seq. from the DDR-SDRAM (also referred to as tAC measurement data signal hereinafter) in a burst read operation.

To measure tAC, semiconductor memory device 1000 enters a test mode from a normal mode. This transition timing is set substantially intermediate between the rising or falling time of an externally applied clock signal and the falling or rising time one cycle previous to that clock signal, corresponding to tAC measurement data signal output from semiconductor memory device 1000.

In the operation wave form diagram of FIG. 4, time t4 at which N1 attains an H level is equal to the time when the tAC measurement data signal is output from output terminal 32 of semiconductor memory device 1000 in a normal mode. It is assumed that the signal propagation time of each of electric lines C1–Cn is adjusted in advance by blowing a fuse so that the signal propagation time of one of electric lines C1–Cn is substantially equal to tAC. Therefore, the period of time required for comparison signal CPI to arrive at a corresponding comparison circuit CPn via an appropriate one of electric lines C1–Cn adjusted to have a signal propagation time of tAC is equal to tAC.

The signal having the voltage level of input signal SIN (clock signal) at time t1 when semiconductor memory device 1000 enters a test mode from a nornmal mode is comparison signal CPI. Therefore, connection nodes M1–Mn attain the voltage level of comparison signal CPI (input signal SIN) delayed for the signal propagation time of each of electric lines C1–Cn.

At time t1, the voltage levels of connection nodes M1–Mn attain the H level delayed for the signal propagation time of a corresponding electric line Cn since input signal SIN is at an H level. Even if input signal SIN is subsequently pulled down to an L level at time t2, each of connection nodes M1–Mn maintains the H level by the signal propagation time of a corresponding one of electric lines C1–Cn.

In semiconductor memory device 1000, the difference between time t2 when input signal SIN attains an L level (i.e. when the clock signal goes low) and time t4 corresponding to the time when the tAC measurement data signal is output becomes tAC. Therefore, at time t4, one electric line Cn having the shortest propagation time among electric line Cn corresponding to connection nodes maintaining an H level voltage among connection nodes M1–Mn can be identified as the electric line having the propagation time adjusted to tAC.

Therefore, the voltage level changes at the border of a determination signal SCP<n> corresponding to a comparison circuit CPn corresponding to an electric line Cn having the signal propagation time adjusted to tAC among determination signals SCP<1> to SCP<n> output from comparison circuits CP1–CPn, respectively. By identifying from which position do determination signals Re corresponding to a parallel-serial conversion of determination signal SCP<n:1> attain a voltage level change, the tAC of semiconductor memory device 1000 can be measured.

Figure 5:
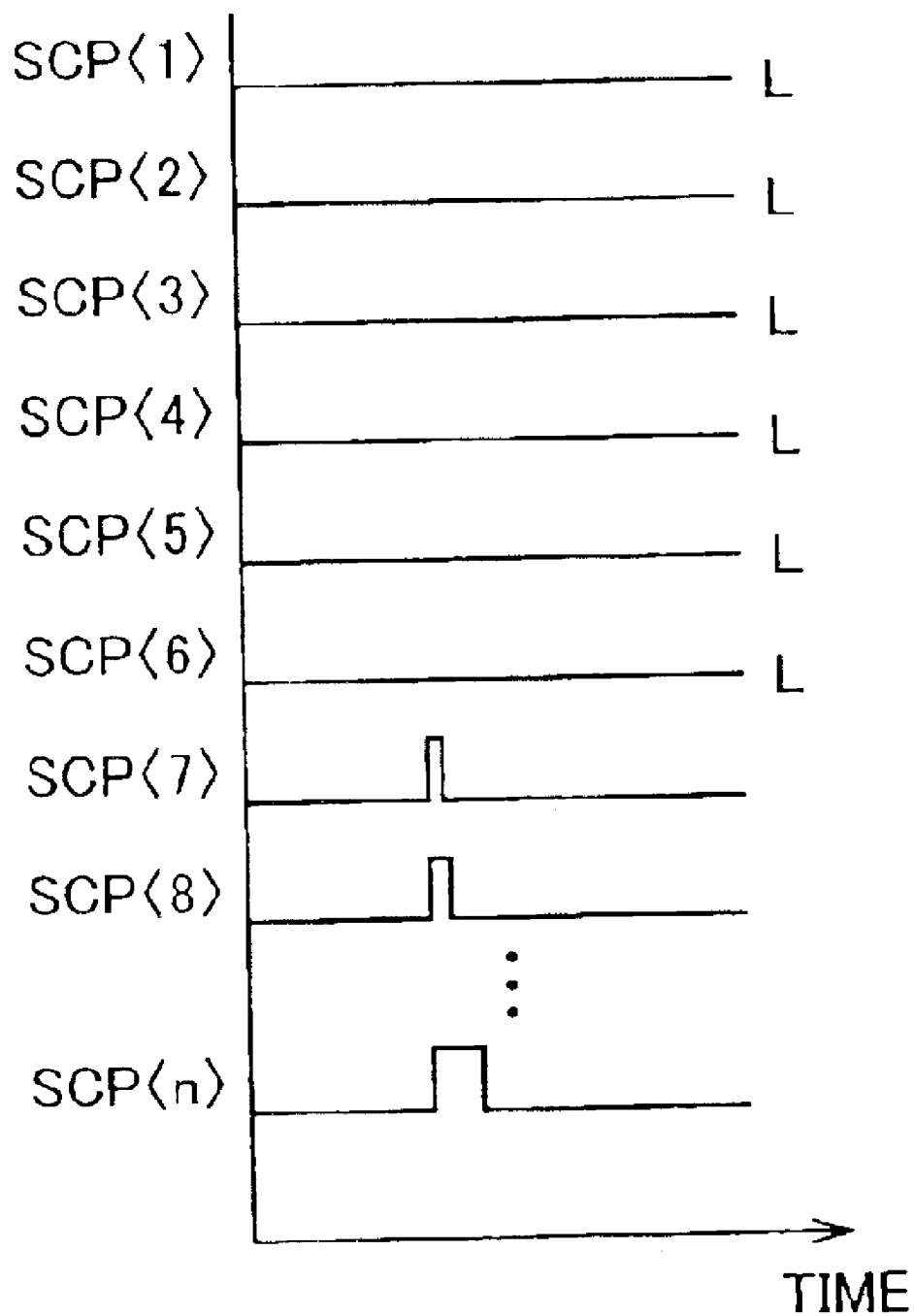
FIG. 5 is an operation waveform diagram of the state of a determination signal output from a comparison circuit according to a first embodiment of the present invention.

Referring to FIGS. 1, 4 and 5, the H level period of determination signal SCP<7> is short since the duration of an H level for both comparison signal CPI and comparison signal CPO applied to comparison circuit CP7 is extremely short. The duration of an H level for both comparison signal CPI and comparison signal CPO applied to each of comparison circuits CP8–CPn becomes longer in the order of electric lines C8–Cn. Therefore, the period of each of determination signals SCP<8> to SCP<n> at an H level becomes longer in the order of determination signals SCP<8> to SCP<n>.

Therefore, in order to effect parallel-serial conversion on determination signals SCP<1> to SCP<n> respectively represented by the waveforms shown in FIG. 5, the period of time of each signal maintaining a voltage level must be substantially equal. Otherwise, proper conversion cannot be conducted by a general parallel-serial conversion circuit. To this end, a circuit configuration that allows proper parallel-serial conversion of determination signals SCP<1>–SCP<n> will be described hereinafter.

Figure 6:
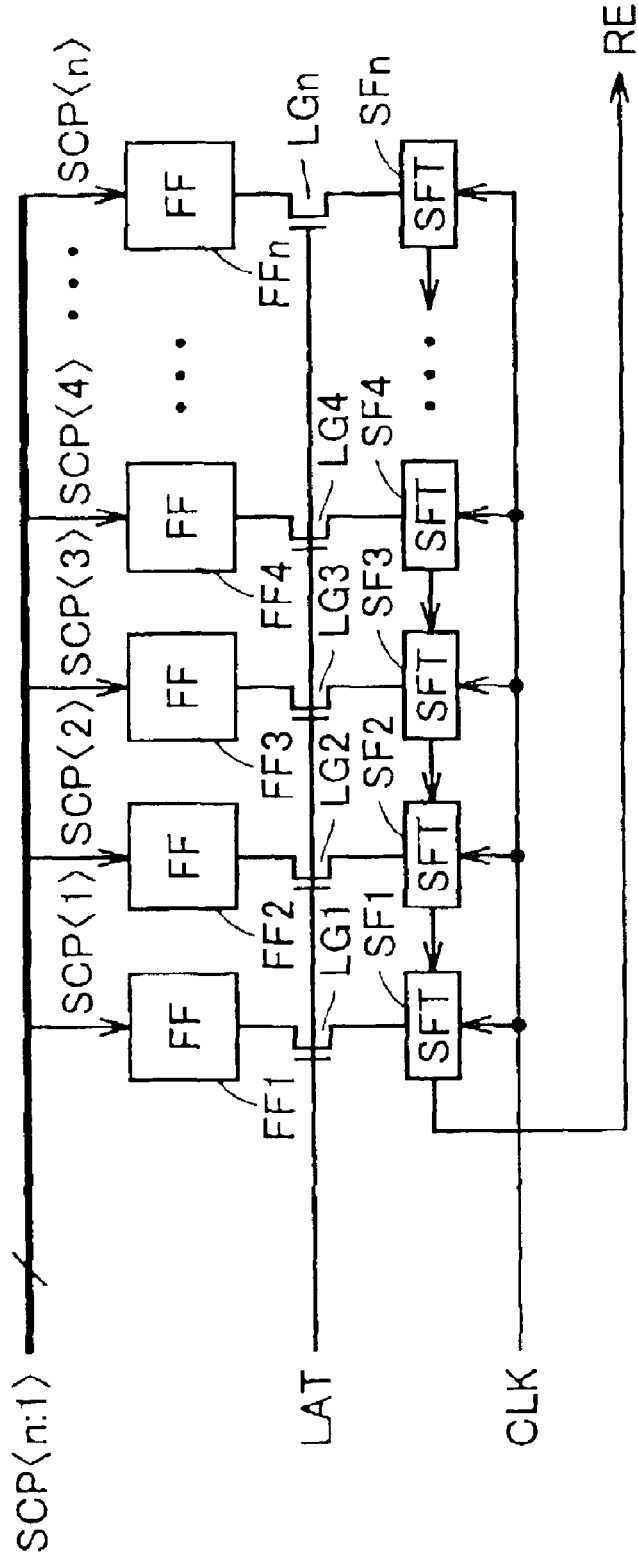
FIG. 6 is a circuit diagram of a structure of a conversion circuit.

Referring to FIG. 6, conversion circuit 30 includes flip-flop circuits FF1–FFn, N channel MOS transistors LG1–LGn, and shift circuits SF1–SFn.

Determination signals SCP<1>–SCP<n> are applied to flip-flop circuits FF1–FFn, respectively. Each of flip-flop circuits FF1–FFn temporarily stores the input signal.

N channel MOS transistors LG1–LGn are provided between flip-flop circuits FF1–FFn and shift circuits SF1–SFn, respectively. A cancel signal LAT is applied to the gates of N channel MOS transistors LG1–LGn. N channel MOS transistors LG1–LGn respond to an input of cancel signal LAT of an H level at their gates to electrically connect flip-flop circuits FF1–FFn with shift circuits SF1–SFn.

To shift circuits SF1–SFn are applied via N channel MOS transistors LG1–LGn, respectively, data signals temporarily stored in respective corresponding flip-flop circuits FF1–FFn and maintained at the voltage level only during the H level period of cancel signal LAT. Each of shift circuits SF1–SFn temporarily stores the input data. Shift circuit SF1 receives the output data from shift circuit SF2. Shift circuit SF2 receives the output data from shift circuit SF3. In other words, shift circuit SFn receives output data from shift circuit SF (n+1).

When cancel signal LAT is set at an L level, each of shift circuits SF1–SFn responds to an externally applied clock signal CLK or a clock signal CLK generated in semiconductor memory device 1000 to output the input data. Eventually, the data stored in each of flip-flop circuits FF1 to FFn is output as a serial determination signal RE sequentially from shift circuit SF1.

According to the above-described circuit configuration of conversion circuit 30, determination signals SCP<1>–SCP<n> represented by the waveforms shown in FIG. 5 can be subjected properly to parallel-serial conversion.

A method of measuring the tAC of semiconductor memory device 1000 will be described here with reference to FIGS. 1, 4 and 6. By way of example, the signal propagation time of electric lines C1–Cn is set to be longer in increments of 20 ps sequentially in the order of electric lines C1–Cn.

When test signal TS attains an L level at time t1, semiconductor memory device 1000 enters a test mode from a normal mode. At the same time, switch circuit 40 breaks the electrical connection between data output circuit 20 and output terminal 32. Also, P channel MOS transistors 11 and 12 are turned on at the same time. Input signal SIN applied to input terminal 31 is sent to delay circuit 200 as comparison signal CPI via P channel MOS transistor 11. Therefore, at time t1, the voltage levels of connection nodes M1–Mn attain an H level delayed for the signal propagation time of each corresponding electric line Cn since input signal SIN is at an H level.

Comparison signal CPI input to delay circuit 200 passes through electric lines C1–Cn to result in n signals having a signal propagation time longer in increments of 20 ps in the order of electric lines C1–Cn. Specifically, in the case where electric line C1 is set so that comparison signal CPI is transmitted at an elapse of 40 ps to comparison circuit CP1, comparison signal CPI will be transmitted to comparison circuit CP2 at an elapse of 60 ps. In a similar manner comparison signal CPI is transmitted to comparison circuits CP3–CP8 at an elapse of 80 ps–180 ps, respectively. Furthermore, comparison signal CPI is transmitted to each of comparison circuits CP9–CPn in a propagation time incremented by 20 ps from 180 ps. When input signal SIN attains an L level at time t2, the voltage level of connection node M1 corresponding to electric line C1 attains an L level at time t3 corresponding to an elapse of 40 ps from time t2. Thus, the voltage levels of connection nodes M2–M8 corresponding to electric lines C2–C8, respectively, attain an L level at an elapse of 60 ps–180 ps from time t2.

Internal circuit 100 carries out a predetermined process in response to input signal SIN applied from input terminal 31 to output a data signal to data output circuit 20. The signal output from data output circuit 20 becomes comparison signal CPO via P channel MOS transistor 12. It is noted that the voltage level of N1 is at an H level at time t4. This means that comparison signal CPO of an H level arrives at each of comparison circuits CP1–CPn at time t4. Each of comparison circuits CP1–CPn outputs a signal corresponding to a logical product between comparison signal CPI input via a corresponding one of electric lines C1–Cn and comparison signal CPO. At time t4, the output signal from comparison circuit CP7 corresponding to electric line C7 corresponding to connection node M7 maintaining an H level is the data that allows determination of tAC.

Since a comparison signal CPI and a comparison signal CPO of an H level are applied to comparison circuits CP7–CPn at time t4, comparison circuits CP7–CPn output determination signals SCP<7>–SCP<n> of an H level, respectively. At time t4, connection nodes M1–M6 do not maintain an H level. Therefore, comparison circuits CP1–CPG corresponding to connection nodes M1–MG, respectively, output determination signals SCP<0>–SCP<6> of an L level, respectively.

Then, determination signal SCP<n:1> is applied to conversion circuit 30. Determination signals SCP<0>–SCP<6> of an L level among determination signal SCP<n:1> are temporarily stored in flip-flop circuits FF1–FFG, respectively. Determination signals SCP<7>–SCP<n> of an H level among determination signal SCP<n:1> are temporarily stored in flip-flop circuits FF7–FFn, respectively.

When test signal TS attaining an L level at time t5 is subsequently pulled up to an H level, semiconductor memory device 1000 enters a normal mode from the test mode. Then, cancel signal LAT is set at an H level for a predetermined period of time. N channel MOS transistors LG1–LGn in conversion circuit 30 are turned on. The data temporarily stored in flip-flop circuits SF1–SFn are applied via N channel MOS transistors LG1–LGn, respectively, to shift circuits SF1–SFn provided corresponding to flip-flop circuits FF1–FFn, respectively. Each of shift circuits SF1–SFn temporarily stores input data. When cancel signal LAT is subsequently set at an L level, shift circuits SF1–SFn respond to clock signal CLK to output each input data. Eventually, each stored data is output as a serial determination signal RE sequentially from shift circuit SF1 in the order of flip-flop circuits FF1–FFn.

Determination signal RE is provided from output terminal 32 as output signal SOUT, whereby determination is made of from which position do the input data signals attain an H level by means of an externally provided counter circuit (not shown) or the like. Since determination signals SCP<7>–SCP<n> are set at an H level in the present embodiment, it is appreciated that the seven output signals and et seq. attain an H level. Therefore determination can be made that the signal propagation time of electric line C7 corresponding to comparison circuit CP7 from which determination signal SCP<7> of an H level has been output is substantially equal to tAC. Thus, it is appreciated that the tAC of semiconductor memory device 1000 is 160 ps since the signal propagation time of electric line C7 is 160 ps in the present embodiment.

Since semiconductor memory device 1000 of the first embodiment incorporates a measurement circuit that outputs data allowing determination of the timing difference between input and output signals, the timing difference between input and output signals can be measured at low cost and at high accuracy.

The present invention is not limited to the present embodiment based on a method of measuring the tAC in the case where the semiconductor device is a DDR-SDRAM. The application range of the present invention is not limited to a semiconductor device identified as a semiconductor memory device such as a DDR-SDRAM. The present invention is applicable common to a semiconductor device including an internal circuit that executes a predetermined process according to an input signal functioning as a trigger to output a signal corresponding to the predetermined process at a timing meeting a predetermined standard by altering the switching timing from a normal mode to a test mode internally based on a standard time that is the subject of measurement.

Modification of First Embodiment

Another structure of altering the electric signal propagation time in electric line Cn and signal line COn in semiconductor memory device 1000 will be described here.

Figure 7:
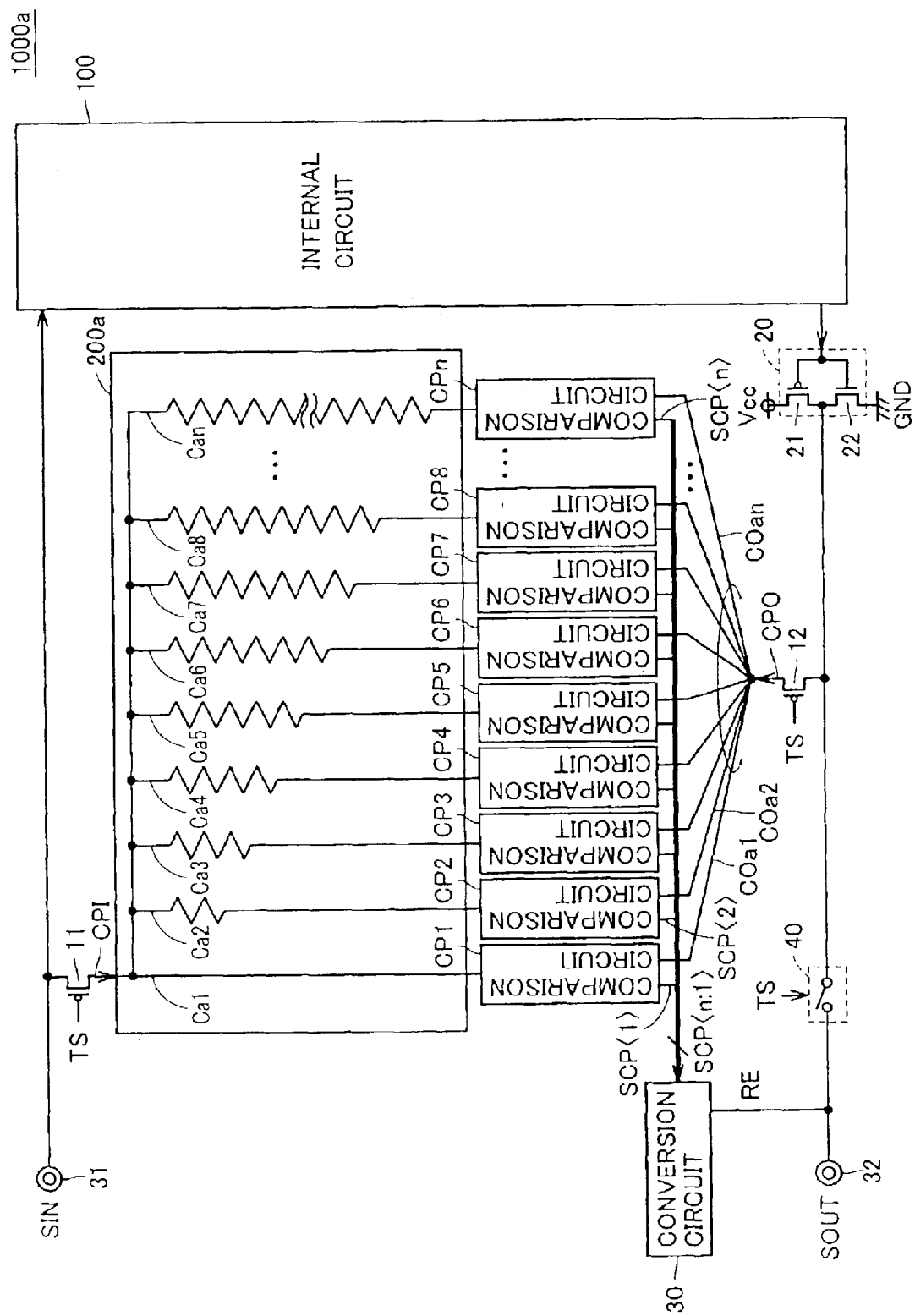
FIG. 7 is a block diagram of a structure of a semiconductor device according to a modification of the first embodiment.

Referring to FIG. 7, a semiconductor memory device 1000a differs from semiconductor memory device 1000 of the first embodiment shown in FIG. 1 in that a delay circuit 200a is provided instead of delay circuit 200, and signal lines COa1–COan are provided instead of signal lines CO1–COn.

Delay circuit 200a differs from delay circuit 200 in that electric lines Ca1–Can are provided instead of electic lines C1–Cn. The remaining structure is similar to that of semiconductor memory device 1000. Therefore, detailed description thereof will not be repeated. In the following, signal lines COa1–COan and electric lines Ca1–Can are also generically represented as signal line COan and electric line Can, respectively.

Figure 8A:
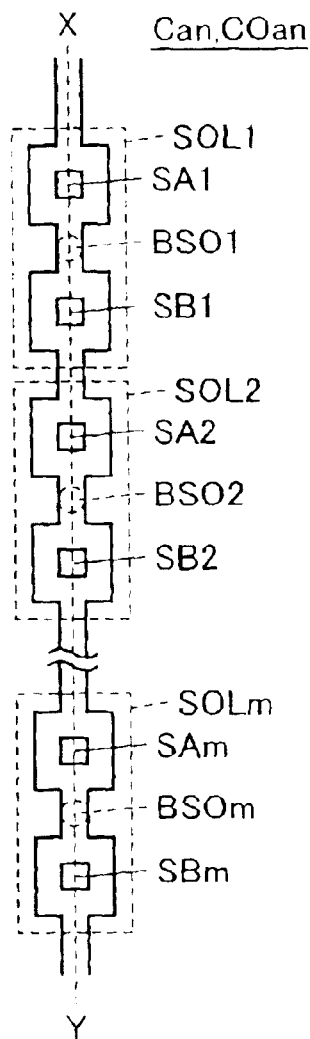
FIGS. 8A and 8B are diagrams to describe another structure of altering the propagation time of an electric signal in electric lines and signal lines.

Referring to FIG. 8A, electric line Can and signal line COan has path length modify sections SOL1–SOLm to apply a predetermined propagation delay time to an electric signal.

Figure 8B:
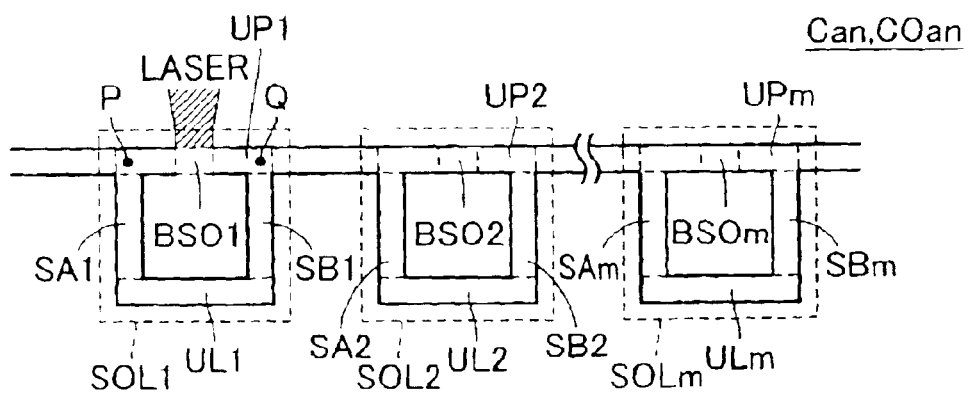

FIG. 8B is a sectional view of electric line Can and signal line COan of FIG. 8A between point X and point Y.

Path length modify sections SOL1–SOLm include upper layer lines UP1–UPm, respectively, through holes SA1–SAm, respectively, through holes SB1–SBm, respectively, and lower layer lines UL1–ULm, respectively. Path length modify section SOL1 includes a fuse BSO1 to break the electrical connection between a point P and a point Q on upper layer line UP1. Similarly, path length modify sections SOL2–SOLm include fuses BSC2–BSOm, respectively, likewise upper layer line UP1.

Upper layer line UP1 is located at the surface of a substrate to provide the shortest connection between points P and Q. Each of upper layer lines UP2–UPm has a structure similar to that of upper layer line UP1. Lower layer lines UL1–ULm located in the substrate correspond to upper layer lines UP1–UPm, respectively, and are disposed respectively below a corresponding upper layer line. Each of through holes SA1–SAm establishes electrical connection between one end of each corresponding upper layer lines UP1–UPm and one end of each corresponding lower layer lines UL1–ULm. Each of through holes SB1–SBm provides electrical connection between the other end of respective corresponding upper layer lines UP1–UPM and the other end of respective corresponding lower layer lines UP1–ULm.

By blowing out fuse BSO1 through laser or the like, electric line Can and signal line COan can transmit an electric signal through the route of through hole SA1, lower layer line UL1 and through hole SB1 instead of through the route of the shortest distance from point P to point Q on upper layer line UP1. Therefore, the path length of an electric signal can be altered depending on whether fuse BSO1 is blown out or not in path length modify section SOL1, likewise electric line Cn shown in FIG. 2B. The electric signal propagation time between points P and Q can be altered in a three dimensional manner, rather than in a two dimensional manner, as electric line Cn.

By setting electric lines Ca1–Can to have 0 to (n−1) blown fuses among fuses BSO1–BSOm, likewise electric lines C1–Cn, the signal propagation time can be sequentially increased in increments of a predetermined time in the order of electric lines Ca1–Can. An advantage similar to that of electric lines Ca1–Can can be achieved for signal lines COa1–COan.

The method of measuring the timing difference between input and output signals of semiconductor memory device 1000a is similar to that previously described for semiconductor memory device 1000. Therefore, detailed description will not be repeated thereof.

As described above, semiconductor memory device 1000a according to a modification of the first embodiment has electric line Can and signal line COan formed in a three dimensional manner, rather than in a two dimensional manner such as electric line Cn and signal COn in semiconductor memory device 1000. Therefore, semiconductor memory device 1000a will require a smaller wiling area on the surface of the substrate. The circuitry area can be reduced.

Second Embodiment

A semiconductor memory device of a structure switching in accordance with an input signal between a plurality of predetermined determination patterns to determine the timing difference between input and output signals will be described hereinafter. The second embodiment is applicable common to a semiconductor device such as a semiconductor memory device including an internal circuit executing a predetermined process in response to an input signal functioning as trigger to output a signal corresponding to the predetermined process at a timing meeting a predetermined standard.

Figure 9:
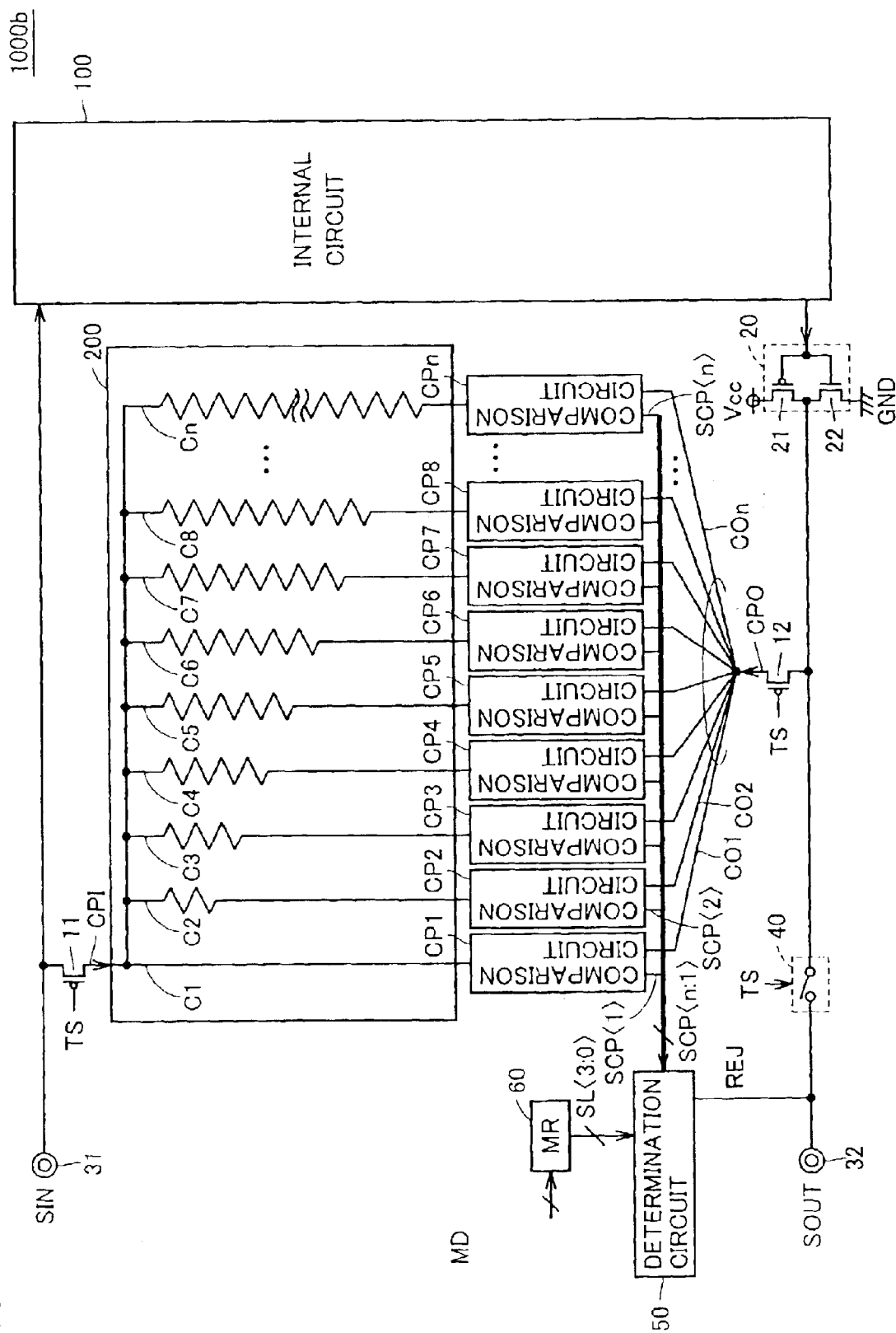
FIG. 9 is a block diagram of a structure of a semiconductor device according to a second embodiment of the present invention.

Referring to FIG. 9, a semiconductor memory device 1000b of the second embodiment differs from semiconductor memory device 1000 of the first embodiment shown in FIG. 1 in that a determination circuit 50 is provided instead of conversion circuit 30, and a mode register 60 is additionally provided. Semiconductor memory device 1000b differs from semiconductor memory device 1000 also in that a determination signal REJ is applied to output terminal 32 instead of determination signal RE. The remaining structure is similar to that of semiconductor memory device 1000. Therefore, detailed description thereof will not be repeated. Determination signal REJ is a signal to determine whether the timing difference between input and output signals meets an expected value set in accordance with a standard value.

Mode register 60 responds to a mode set signal MD output from an internal circuit (not shown) in semiconductor memory device 1000b to output a mode select signal SL<3:0>. Mode select signal SL<3:0> is applied to determination circuit 50. Determination circuit 50 outputs determination signal REJ.

Figure 10:
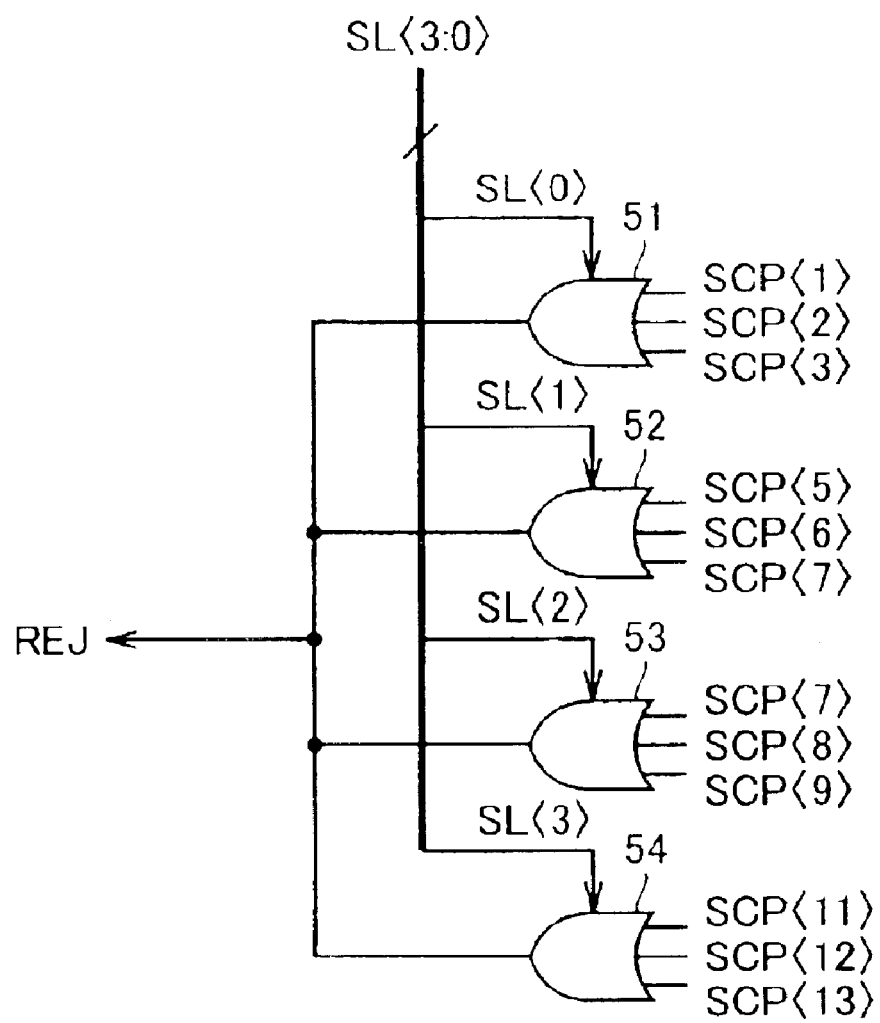
FIG. 10 is a circuit diagram of a structure of a determination circuit.

Referring to FIG. 10, determination circuit 50 includes OR circuits 51, 52, 53 and 54. OR circuits 51, 52, 53 and 54 attain an active state or inactive state according to mode select signals SL<0>–SL<3>. Each of OR circuits 51, 52, 53 and 54 is rendered active according to a mode select signal of an H level, and rendered inactive according to a mode select signal of an L level. Only one of mode select signals SL<0>–SL<3> is set at an H level, and the remaining mode select signals are set at an L level. Therefore, only one of OR circuits 51, 52, 53 and 54 is rendered active in response to mode select signal SL<3:0>. Three signals are applied to each of OR circuits 51, 52, 53 and 54. Each of OR circuits 51, 52, 53 and 54 outputs a signal corresponding to a logical sum of the three signals as determination signal REJ when active. Determination signal REJ is output as output signal SOUT from output terminal 32.

Each of OR circuits 51, 52, 53 and 54 has its input signal set in accordance with the type of the timing difference between input and output signals. For example, consider a configuration in which electric line C1 transmits comparison signal CPI at an elapse of 100 ps to comparison circuit CP1. By way of example, it is assumed that the signal propagation time of electric lines C1–Cn is set to be sequentially increased by 10 ps in the order of electric lines C1–Cn. Therefore, comparison signal CPI is transmitted to each of comparison circuits CP2–CP8 after 110 ps–170 ps.

In the case where the timing difference is to be measured between input and output signals designed so that the timing difference between the input and output signals of the subject of measurement becomes 110 ps in semiconductor memory device 1000b of the above-described condition, determination signal SCP<2> output from comparison circuit CP2 is set as the determination reference signal. Determination circuit 50 is configured so that, when the tolerance of the standard value of the timing difference between the input and output signals of the subject of measurement is i 10 ps, the signals preceding and succeeding the relevant determination reference signal, i.e., determination signals SCP<1> and SCP<3>, are applied to OR circuit 51.

As a result, in the case where the timing difference between input and output signals including the tolerance of the standard value is in the range of 100 ps–120 ps, OR circuit 51 outputs a determination signal REJ of an H level if mode select signal SL<0> is at an H level and at least one of determination signals SCP<1>–SCP<3> is at an H level. When determination signal REJ of an L level is output from OR circuit 51, determination can be made that the timing difference between input and output signals of the subject of measurement including the tolerance of the standard value is not in the range of 100 ps–120 ps. Therefore, semiconductor memory device 1000b that is the subject of measurement can be identified as a faulty product. Similarly, respective OR circuits 52, 53 and 54 receive a determination signal SCP<n> that becomes the reference in accordance with the timing difference between input and output signals of the subject of measurement as well as preceding and succeeding signals thereof when the tolerance of the standard value is ±10 ps, likewise OR circuit 51. Thus, by switching the OR circuit rendered active in accordance with mode select signal SL<3:0> set by mode register 60, determination can be made whether a plurality of different timing differences between input and output signals including the tolerance of the standard value meets the expected value set in accordance with the standard value.

The number of signals input to each of OR circuits 51–54 is not limited to three. By applying four or more signals to each of OR circuits 51–54, determination can be made whether the timing difference between input and output signals of a wider tolerance range of the standard value meets the expected value set in accordance with the standard value. Furthermore, the number of OR circuits is not particularly limited, and should be increased or decreased in accordance with the number of timing differences between input and output signals of the subject of measurement.

Semiconductor memory device 1000b of the second embodiment is advantageous in that an external counter circuit or the like is dispensable by incorporating a circuit that can determine whether the timing difference between input and output signals including the tolerance of the standard value of the subject of measurement meets an expected value set in accordance with the standard value. Accordingly, the cost of measurement facility can be further reduced than semiconductor memory device 1000 of the first embodiment. Since semiconductor memory device 1000b does not have to determine the measurement result through an external counter or the like such as in semiconductor memory device 1000 of the first embodiment, the time required for signal measurement can also be reduced significantly.

In the semiconductor memory device of the above-described embodiments, only a transistor functioning as a switch is provided between the delay circuit and the input terminal. The advantages of the semiconductor memory device of the above-described embodiments can be obtained even by providing an input protection circuit or the like between the input terminal and the transistor.

Semiconductor devices of mass production may have the wiring length of internal electric line differing slightly from the design value, leading to slight difference in the signal propagation time of the electric line from the design value. The error in signal propagation time of electric lines will become larger as the electric line becomes longer. Thus, in the semiconductor device, the signal propagation time error of electric lines can be corrected by employing electric line Cn shown in FIG. 2A or electric line Can shown in FIGS. 8A and 8B for electric lines of great length and blowing out the fuse according to the signal propagation time error.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with a normal mode and a test mode as an operation mode, comprising:

an internal circuit executing a predetermined process in accordance with an input signal to provide an output signal in accordance with said predetermined process;

a delay circuit delaying said input signal by respective different delay times to output n (n: natural number) delay signals in said test mode; and n comparison circuits provided corresponding to said n delay signals, respectively, each of said n comparison circuits providing a comparison result indicating which of a corresponding delay signal output and said output signal from said internal circuit is output earlier in said test mode.

2. The semiconductor device according to claim 1, wherein said delay circuit includes n electric lines sequenced in advance, each delaying said input signal by said different delay times, and said n electric lines having n path lengths, respectively, sequentially increased in length in increments of a predetermined distance in an order from the first to n-th electric lines.

3. The semiconductor device according to claim 2, wherein each of said n comparison circuits includes a logic circuit providing a comparison determination signal based on a logic operation between said corresponding delay signal and said output signal in said test mode, said semiconductor device further comprising:

a conversion circuit providing n comparison determination signals sequenced in advance, output from said n comparison circuits one by one in the order from the first to n-th comparison determination signals in said test mode, an output terminal providing said output signal to an external source in said normal mode, and a path switch provided between said output terminal and said internal circuit for disconnecting a path of providing said output signal to said external source in said test mode, wherein said n comparison determination signals from said comparison circuit are provided from said output terminal to said external source in the order from the first to n-th comparison determination signals in said test mode.

4. The semiconductor device according to claim 3, wherein said conversion circuit includes n temporary storage circuits sequenced in advance, temporarily storing said n comparison determination signals respectively, n shift circuits provided corresponding to said n temporary storage circuit, respectively, and n switches provided between said n temporary storage circuits and said n shift circuits, respectively, wherein each of said n shift circuits temporarily stores applied data, and a p-th (p: natural number of at least 2 and not more than n) shift circuit responds to a clock signal to output said applied data from a (p+1)th shift circuit to a (p−1)th shift circuit, said n switches electrically connecting said n temporary storage circuits with said n shift circuits for a predetermined period after said n temporary storage circuits temporarily store said n comparison determination signals, respectively, and electrically disconnecting said n temporary storage circuits from said n shift circuits at an elapse of said predetermined period, each of said n shift circuits receives said comparison determination signal from a corresponding temporary storage circuit for said predetermined period, and said n comparison determination signals are output from the first shift circuit in order from the first to n-th comparison determination signals at an elapse of said predetermined period in response to said clock signal.

5. The semiconductor device according to claim 2, wherein each of said n electric lines has a path length modify section to delay said input signal for a predetermined time, said path length modify section having a first line electrically connecting first and second nodes located at respective sides of a predetermined site through a route of said predetermined site at a first distance, a second line electrically connecting said first and second nodes at a second distance differing from said first distance, said second line capable of being cut from outside said delay circuit, said first distance being shorter than said second distance.

6. The semiconductor device according to claim 2, wherein each of said n electric lines has a path length modify section to delay said input signal for a predetermined time, said path length modify section having a first line electrically connecting first and second nodes located at respective sides of a predetermined site through a route of said predetermined site at a first distance, second line electrically connecting said first and second nodes at a second distance differing from said first distance through a route above or below said first line, said second line capable of being cut from outside said delay circuit, said first distance being shorter than said second distance.

7. The semiconductor device according to claim 2, wherein each of said n comparison circuits includes a first logic circuit providing a comparison determination signal based on a logic operation between said corresponding delay signal and said output signal in said test mode, said semiconductor device further comprising a determination circuit receiving n comparison determination signals sequenced in advance, output from said n comparison circuits in said test mode.

wherein said determination circuit includes a plurality of second logic circuits to which are applied an arbitrary group of said n comparison determination signals in said test mode, each arbitrary group of said n comparison determination signals partially having different comparison determination signals from each other, said each arbitrary group of n comparison determination signals including m(m: natural number smaller than n) sequential comparison determination signals among said n comparison determination signals, and each of said plurality of second logic circuits providing a logic operation result of said m sequential comparison determination signals.

8. The semiconductor device according to claim 7, wherein said plurality of second logic circuits are selectively rendered active in accordance with a time required for said output signal from said internal circuit to be applied to said n comparison circuits.

9. The semiconductor device according to claim 7, further comprising:

an output terminal providing said output signal to an external source in said normal mode; and a path switch provided between said output terminal and said internal circuit for disconnecting a path of providing said output signal to said external source in said test mode, wherein said logic operation result from said determination circuit is output from said output terminal to said external source in said test mode.

* * * * *